United States Patent
Chen et al.

(10) Patent No.: US 12,267,029 B2
(45) Date of Patent: Apr. 1, 2025

(54) METHOD FOR OBTAINING PARAMETER OF SYNCHRONOUS MOTOR

(71) Applicant: DELTA ELECTRONICS, INC., Taoyuan (TW)

(72) Inventors: Yen-Yang Chen, Taoyuan (TW); Jen-Chih Tseng, Taoyuan (TW); Lei-Chung Hsing, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 149 days.

(21) Appl. No.: 18/098,121

(22) Filed: Jan. 18, 2023

(65) Prior Publication Data

US 2024/0113646 A1   Apr. 4, 2024

(30) Foreign Application Priority Data

Sep. 30, 2022   (CN) .......................... 202211206154.7

(51) Int. Cl.
*H02P 21/22*   (2016.01)
*H02P 21/14*   (2016.01)

(52) U.S. Cl.
CPC .............. *H02P 21/22* (2016.02); *H02P 21/14* (2013.01); *H02P 2207/05* (2013.01)

(58) Field of Classification Search
CPC ....... H02P 21/22; H02P 21/14; H02P 2207/05
USPC .................................................... 318/400.02
See application file for complete search history.

(56) References Cited

FOREIGN PATENT DOCUMENTS

| CN | 107994828 B |   | 1/2020 |   |
|----|-------------|---|--------|---|
| CN | 111726045 A | * | 9/2020 | ............. H02P 21/14 |
| CN | 112968644 A |   | 6/2021 |   |
| CN | 113676086 A |   | 11/2021 |   |
| CN | 111641362 B |   | 4/2022 |   |

OTHER PUBLICATIONS

Office Action dated Apr. 11, 2023 of the corresponding Taiwan patent application No. 111137179.

* cited by examiner

*Primary Examiner* — Kawing Chan
(74) *Attorney, Agent, or Firm* — Chun-Ming Shih; HDLS IPR SERVICES

(57) ABSTRACT

A method of obtaining a parameter of a synchronous motor is disclosed and includes: setting an operating current of the motor; providing a positive fixed voltage to the motor and monitoring a feedback current from the motor; recording a triggering time for the feedback current to reach the operating current; providing a negative fixed voltage to the motor for the triggering time; obtaining a square-wave voltage with a fixed frequency based on the positive fixed voltage and the negative fixed voltage being provided; providing the square-wave voltage with the fixed frequency to one axis of the motor; transforming three-phase current from the motor into an axial current; computing an inductance value of this axis based on the fixed frequency, the square-wave voltage and the axial current; and, creating an inductance-current parameter table based on a plurality of the inductance values and the axial currents correspondingly.

13 Claims, 9 Drawing Sheets

METHOD FOR OBTAINING PARAMETER OF SYNCHRONOUS MOTOR

BACKGROUND

Technical Field

The present disclosure relates to a motor, and in particular to a method for obtaining a parameter of the motor.

Description of Related Art

In related arts, in order to use an inverter to properly control a system, it is necessary to perform "auto-tuning" for a motor used with the inverter to adjust various parameters used by the inverter to control the motor, such as resistance value and inductance value, etc.

In order to achieve the above purpose, the inverter generally needs to establish a complete inductance parameter model for the motor to record a corresponding relationship between different current points and inductance values.

In related arts measurement method of the inductance value of the motor, the inverter applies a sine wave voltage to a known rotor position of the motor, so that when a current slowly rises to the current point to be observed, a resistance method is used to calculate an inductance value corresponding to the current point. By observing and calculating the inductance value resulted from current, which is gradually increased from a small current, the inverter establishes the corresponding relationship between the current and the inductance.

However, for the process of establishing the corresponding relationship between the current and the inductance of the motor through the above method, the measurement for larger current range (namely, the resolution of the current point is higher) requires a longer measurement time. In some embodiments, if it takes 3 seconds to wait for the current to rise to the current point to be observed, the inverter takes 300 seconds to record 100 current points and the inductance values corresponding to these current points.

In addition, in a process of gradually increasing the applied current of the inverter, it may also cause the rotor inside the motor to vibrate, and may affect an accuracy of a measurement result of the inductance value.

SUMMARY

The main purpose of the present disclosure is to provide a method for obtaining a parameter of a synchronous motor, which may establish a parameter table of inductance versus current in a very short time.

In some embodiments, the method for obtaining the synchronous parameter of the motor includes the following steps:
a) setting an operating current value of the motor;
b) an inverter provides a positive fixed voltage to the motor, and detects a feedback current of the motor;
c) recording a touch time when the feedback current reaches the operating current value, and providing continually a negative fixed voltage to the motor to reach the touch time;
d) obtaining a square wave voltage with a fixed frequency based on the positive fixed voltage and the negative fixed voltage;
e) applying the square wave voltage with the fixed frequency to a first axis of the motor;
f) detecting a three-phase current fed back by the motor, and converting the three-phase current into an axial current of the first axis;
g) calculating a first inductance value of the first axis based on the fixed frequency, a voltage value of the square wave voltage, and a current value of the axial current; and
h) establishing and storing a parameter table of inductance versus current according to the first inductance value and the corresponding current value.

In some embodiments, the method for obtaining the synchronous parameter of the motor includes the following steps:
a1) the inverter injects a direct current into a direct axis (D-axis) of the motor, so that a rotor of the motor is located at a measurement position;
a2) providing a square wave voltage with a fixed frequency to the D-axis of the motor;
a3) detecting the three-phase current fed back by the motor, and converting the three-phase current into a first D-axis current;
a4) calculating a D-axis self-inductance value based on the fixed frequency, a voltage value of the square wave voltage, and a current value of the first D-axis current;
a5) before a preset cycle quantity or a preset time elapsed, performing the step a1) to the step a4) continually;
a6) after the preset cycle quantity or the preset time elapsed, establishing and storing a D-axis self-inductance parameter table according to a plurality of the D-axis self-inductance values and the current value corresponding to each D-axis self-inductance value;
b1) after the step a6), the inverter injects the direct current into the D-axis of the motor, so that the rotor of the motor is located at the measurement position;
b2) providing the square wave voltage with the fixed frequency to a quadrature axis (Q-axis) of the motor;
b3) detecting the three-phase current fed back by the motor, and converting the three-phase current into a first Q-axis current;
b4) calculating a Q-axis self-inductance value based on the fixed frequency, the voltage value of the square wave voltage, and a current value of the first Q-axis current;
b5) before the preset cycle quantity or the preset time elapsed, performing the step b1) to the step b4) continually; and
b6) after the preset cycle quantity or the preset time elapsed, establishing and storing a Q-axis self-inductance parameter table according to a plurality of the Q-axis self-inductance values and the current value corresponding to each Q-axis self-inductance value.

Compared with the related art, a technical effect of the present disclosure is that the inverter establishes the parameter table of inductance versus current for the motor in a very short time. In this way, when the inverter controls the motor, it may obtain better control performance and solve the problem of current oscillation at the same time.

DETAILED DESCRIPTION

Hereinafter, some embodiments of the present disclosure are described in detail later in conjunction with the drawings.

Figure 1:
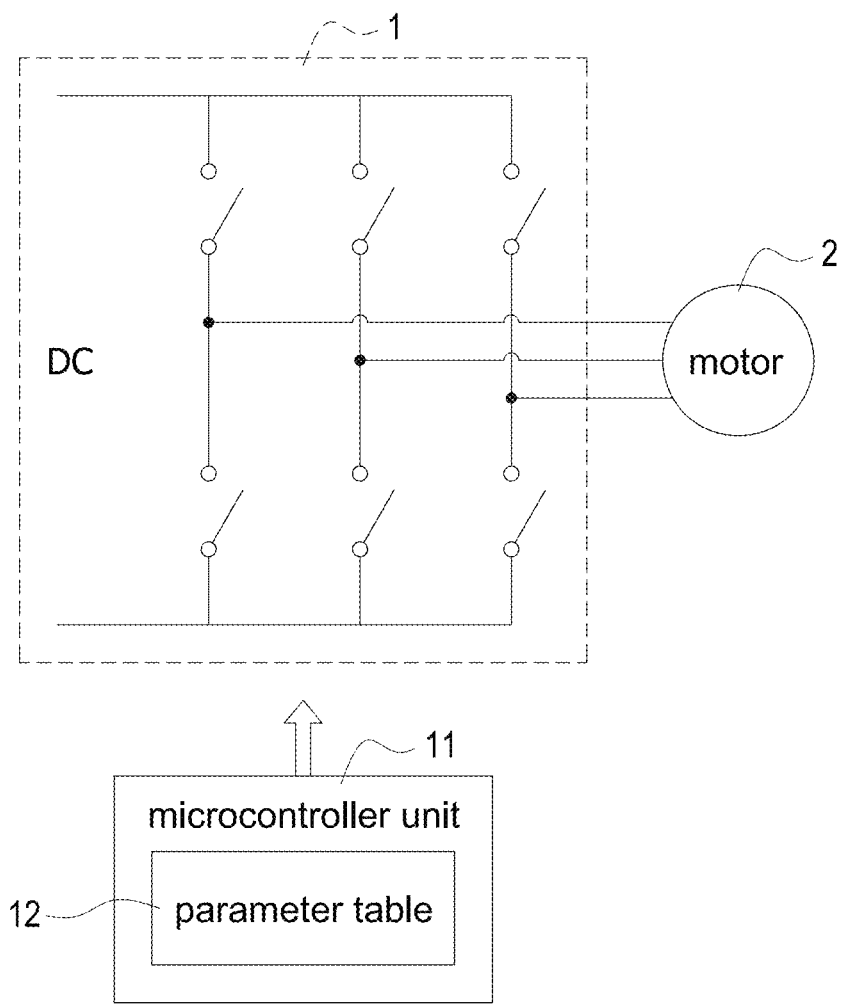
FIG. 1 is a specific embodiment of a schematic diagram of a control architecture of the present disclosure.

First, please refer to FIG. 1, which is a schematic diagram of a control architecture according to an embodiment of the present disclosure. The present disclosure discloses a method for obtaining a parameter of a motor, and the method is mainly applied to a driver or an inverter 1 for controlling the motor 2. For ease of understanding, the following description illustrates the method of implementing the present disclosure by using the inverter 1 as an example.

In some embodiments, before controlling the motor 2, the parameter (for example, an inductance value is used in the present disclosure) of the motor 2 is obtained by measurement. In this way, the inverter 1 may refer to the measured parameters to achieve better control performance when the inverter 1 actually controls the motor 2.

It is worth mentioning that the method of the present disclosure is applied to various synchronous motors through the inverter 1, and here is not intended to limit the form of the motor.

In the method of the present disclosure, the inverter injects a square wave voltage with a fixed frequency at a known rotor position on the motor 2, monitors a feedback current of the motor 2, and finally calculates a corresponding inductance value through an equation. In order to be implemented on the inverter 1, the method of the present disclosure is implemented mainly through a computer-readable code, and recorded in the microcontroller unit 11 of the inverter 1. After the inverter 1 performs the computer-readable code through the microcontroller unit 11, the inverter 1 controls the currently used motor 2 to jointly implement the method of the present disclosure.

Figure 2:
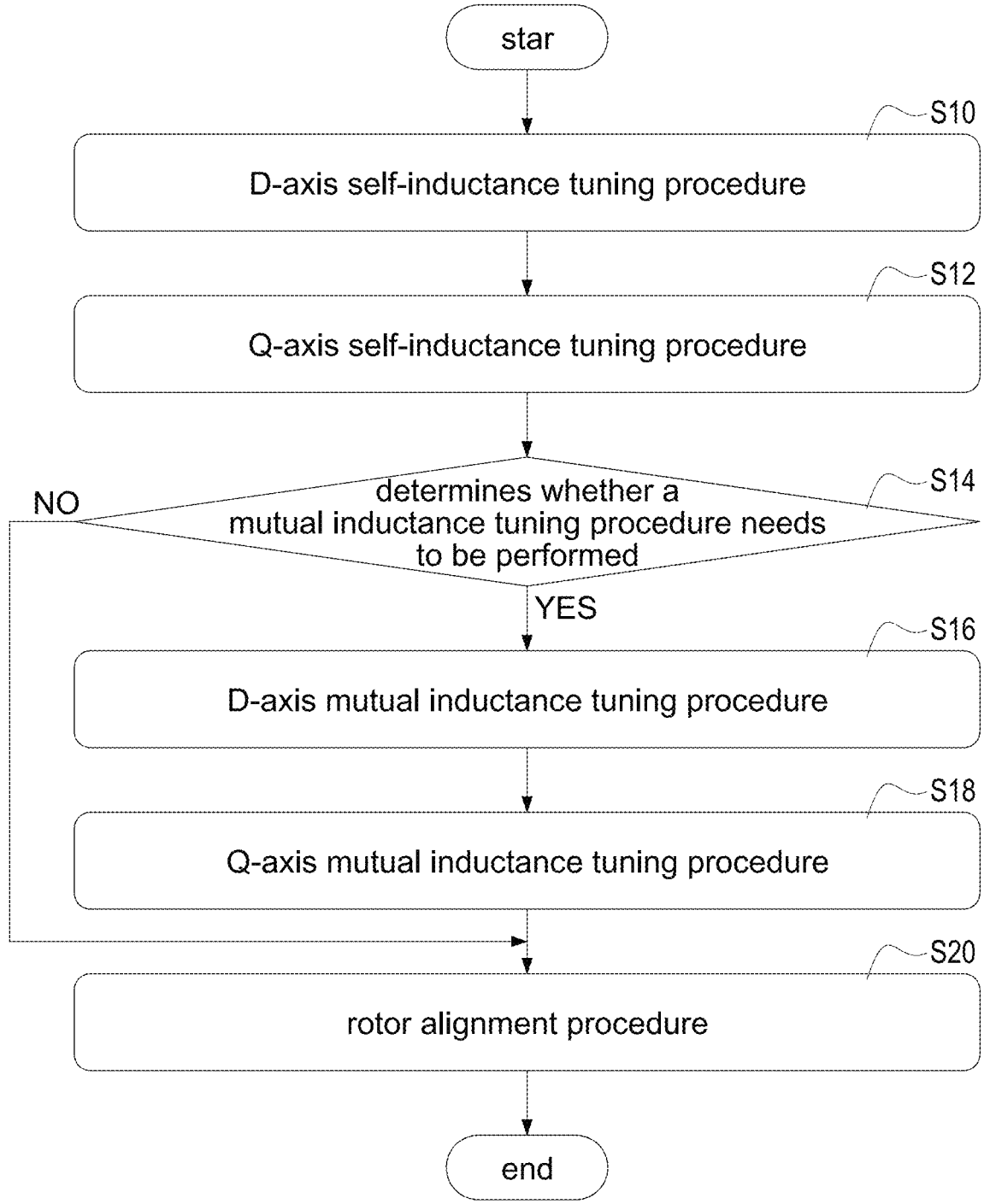
FIG. 2 is a specific embodiment of a self-learning flow chart of the present disclosure.

Please refer to FIG. 2, which is the auto-tuning flow chart according to an embodiment the present disclosure. As mentioned above, a technical solution of the present disclosure is that after the inverter 1 determines a frequency that meets the conditions (hereinafter referred to as a fixed frequency), the inverter 1 provides the square wave voltage with the fixed frequency to the motor 2. The inverter 1 continuously detects the feedback current of the motor 2 during a period of supplying the square wave voltage, and calculates the corresponding inductance value based on the frequency value, voltage value, and current value in the same cycle. In the present disclosure, the above-mentioned procedure is referred to as an inductor auto-tuning procedure.

In some embodiments, the motor 2 has a direct axis (also called a D-axis) and a quadrature axis (also called a Q-axis). In the embodiment of FIG. 2, the inverter 1 first performs a D-axis self-inductance tuning procedure for the motor 2 through the method of the present disclosure (step S10). After recording a D-axis self-inductance value with a required value range or number, the inverter 1 then performs a Q-axis self-inductance tuning procedure for the motor 2 through the same method (step S12) to record a Q-axis self-inductance value with a required value range or number.

In some embodiments, after the above-mentioned self-inductance tuning procedure (including the D-axis self-inductance tuning procedure and the Q-axis self-inductance tuning procedure) is completed, the inverter 1 determines, based on an internal setting value, whether a mutual inductance tuning procedure needs to be performed (step S14).

Specifically, a mutual inductance effect of some motors is not strong, and a performance of the motors is not greatly affected when the motor is controlled without considering the parameters corresponding to a mutual inductance. In this case, a user may set a setting value of the inverter 1, so that the inverter 1 does not perform the mutual inductance tuning procedure.

In some embodiments, when the inverter 1 determines, based on some characteristics or data of the motor 2 currently matched or an internal setting value, that the mutual inductance tuning procedure needs to be performed, the inverter 1 first performs a D-axis mutual inductance tuning procedure for the motor 2 (step S16) to obtain all D-axis mutual inductance values with a required value range or number. Next, the inverter 1 performs a Q-axis mutual inductance tuning procedure for the motor 2 (step S18) to obtain all Q-axis mutual inductance values with a required value range or number.

In some embodiments, before injecting a square wave voltage into the motor 2 to perform the above tuning procedure, a specific direct current needs to be injected into the motor 2 in advance, so that the rotor of the motor 2 may be located at a desired measurement position. In other words, the rotor position of the motor 2 needs to be estimated to ensure that the rotor of the motor 2 is indeed located at the desired measurement position. Therefore, after both the self-inductance tuning procedure and the mutual inductance tuning procedure are completed, the inverter 1 performs the rotor alignment procedure for the motor 2 (step S20) to restore the rotor to an initial position.

In some embodiments, after step S20, the inverter 1 controls the motor 2 with reference to the D-axis self-inductance value obtained through the D-axis self-inductance tuning procedure, the Q-axis self-inductance value obtained through the Q-axis self-inductance tuning procedure, the D-axis mutual inductance value obtained through the D-axis mutual inductance tuning procedure, and the Q-axis mutual inductance value obtained through the Q-axis mutual inductance tuning procedure, so as to improve the control efficiency.

Specifically, the inverter 1 of the present disclosure mainly performs similar steps to realize the D-axis self-inductance tuning procedure, the Q-axis self-inductance tuning procedure, the D-axis mutual inductance tuning procedure, and the Q-axis mutual inductance tuning procedure respectively. In some embodiments, the difference among the aforementioned tuning procedures is that whether the D-axis or the Q-axis of the motor 2 the inverter 1 needs to provide a square wave voltage to, and whether it is necessary to excite the one of the axes in advance before providing the square wave voltage to another one of the axes (for example, the D-axis or the Q-axis) of the motor 2 (detailed described later). Moreover, when performing the above tuning procedures, the inverter 1 needs to measure the motor 1 currently used to obtain the square wave voltage to be used in the tuning procedures and the fixed frequency to be used for the square wave voltage.

Figure 3:
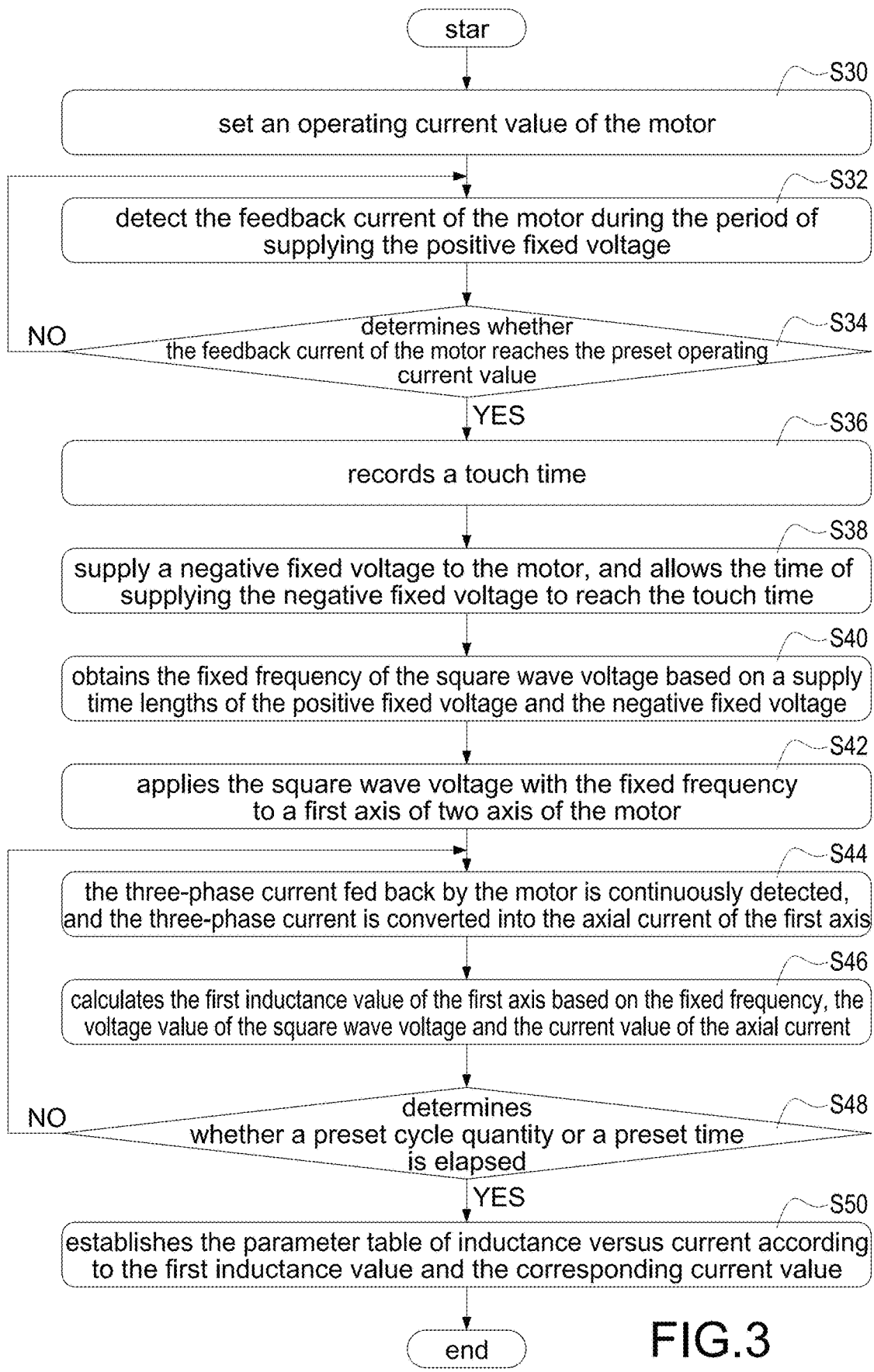
FIG. 3 is a first specific embodiment of a measurement flow chart of the present disclosure.

Please refer to FIG. 3, which is the first specific embodiment of the measurement flow chart of the present disclosure. FIG. 3 discloses the specific implementation steps of the method of the present disclosure, and these steps are mainly recorded in the microcontroller unit 11 of the inverter 1 in the form of computer executable code. After the microcontroller unit 11 performs the computer executable code, the motor 2 is controlled to perform the steps shown in FIG. 3.

As shown in FIG. 3, before performing the tuning procedure of the motor 2, the inverter 1 needs to set an operating current value of the motor 2 (step S30). In some embodiments, the operating current value refers to the maximum operable current value of the motor 2.

Specifically, different motors have different parameters such as the number of revolutions, the number of watts, and the number of poles, and the user sets the maximum operable current value of the motor 2 according to the control method he/she wants to achieve. In some embodiments, the maximum operable current value may be positively correlated with a current limit of the inverter 1, and may be determined according to an operating conditions and actual demands of an environment where the inverter 1 and the motor 2 are located. In some embodiments, the maximum operable current value may be set to, for example but not limited to, 170% of a rated current of the inverter 1.

In some embodiments, after determining the operating current value of the motor 2, the inverter 1 continues to provide a positive fixed voltage to the motor 2, and continues to detect the feedback current of the motor 2 during the period of supplying the positive fixed voltage (step S32).

In some embodiments, when the motor 2 receives the positive fixed voltage, its feedback current continues to increase. At this time, the inverter 1 continuously determines whether the feedback current of the motor 2 reaches the preset operating current value (step S34). Before the feedback current of the motor 2 reaches the operating current value, the inverter 1 continues to perform the step S32 to continuously provide the positive fixed voltage and continuously detect the feedback current of the motor 2.

In some embodiments, when determining that the feedback current of the motor 2 reaches the operating current value, the inverter 1 records a touch time between the time point when the inverter 1 starts to supply the positive fixed voltage and the time point when the feedback current reaches the operating current value (step S36). Next, the inverter 1 stops supplying the positive fixed voltage to the motor 2, and instead supply a negative fixed voltage to the motor 2 for a time equal to the touch time recorded in step S36 (step S38).

In some embodiments, the positive fixed voltage and the negative fixed voltage are voltages having same magnitude and opposite phases. In some embodiments, an absolute value of the positive fixed voltage and the negative fixed voltage is equal to the maximum phase voltage of the inverter 1.

Specifically, the maximum value of the phase voltage is related to the use environment of the inverter 1. For example, different factories may provide different AC input voltages to the inverter 1. Therefore, different use environments and different types of the inverter 1 may have different maximum phase voltages, so the positive fixed voltage and the negative fixed voltage are also different. In related arts, the conversion between of the AC input voltage and the phase voltage is a common knowledge in the technical field, and thus the detailed description thereof is not repeated here.

In some embodiments, after step S38, the inverter 1 obtains the square wave voltage based on the positive fixed voltage and the negative fixed voltage provided to the motor 2. And, the inverter 1 obtains the fixed frequency of the square wave voltage based on a supply time lengths of the positive fixed voltage and the negative fixed voltage (for example, the above-mentioned touch time) (step S40). Further, the voltage value of the square wave voltage corresponds to the voltage value of the positive fixed voltage and the negative fixed voltage, and the fixed frequency is a reciprocal of twice the touch time.

Figure 5:
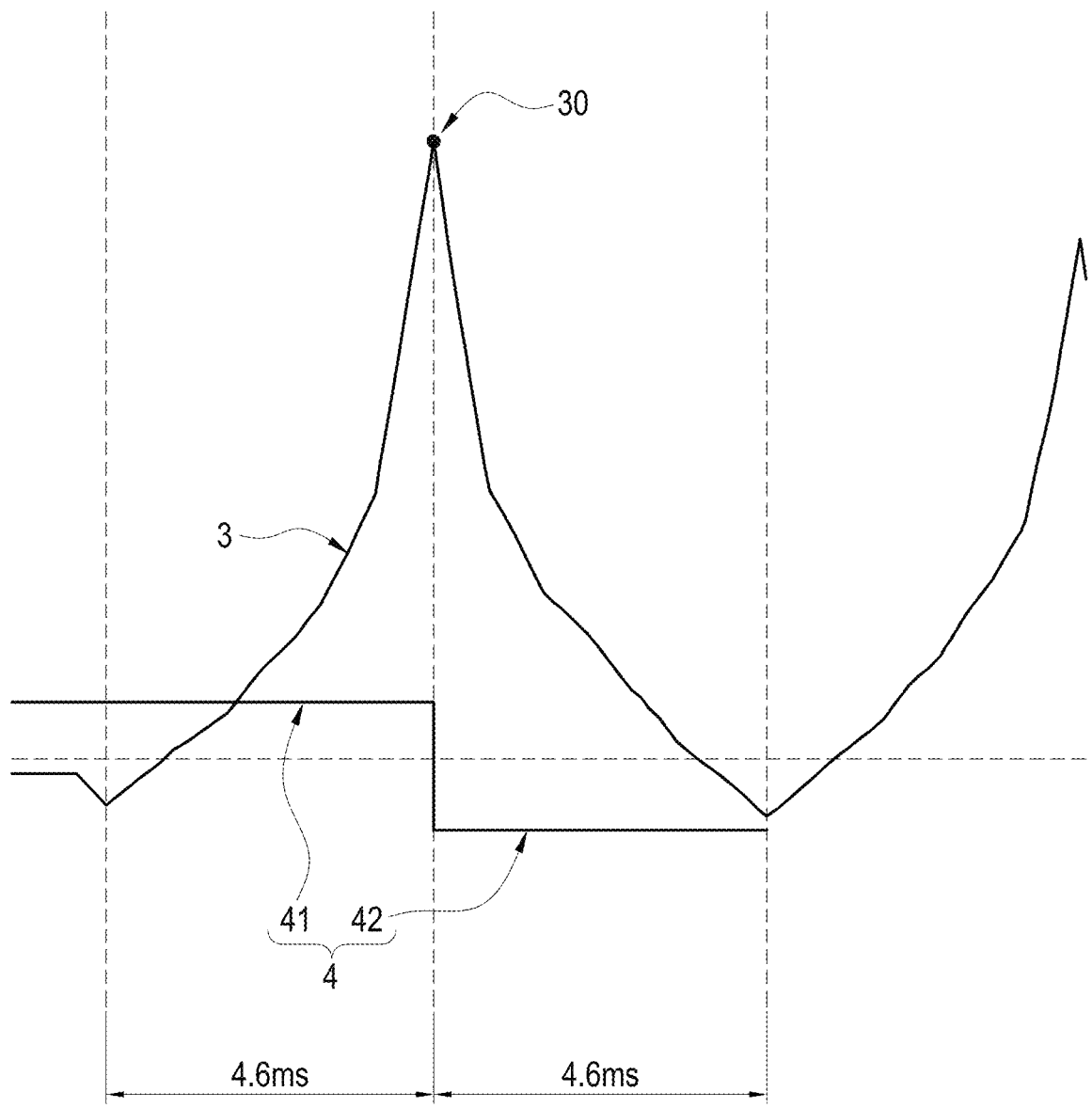
FIG. 5 is a specific embodiment of a schematic diagram of a square wave voltage of the present disclosure.

Please also refer to FIG. 5, which is a specific embodiment of the schematic diagram of the square wave voltage of the present disclosure. In the embodiment of FIG. 5, the positive fixed voltage 41 is +266V, and the negative fixed voltage 42 is −266V.

As shown in FIG. 5, after the inverter 1 starts to provide the positive fixed voltage 41 to the motor 2, feedback current 3 of the motor 2 starts to increase. When the feedback current 3 of the motor 2 reaches the preset operating current value 30, the inverter 1 records the touch time it takes for the feedback current 3 to reach the operating current value 30 (for example, 4.6 millisecond in FIG. 5). At the same time, the inverter 1 stops supplying the positive fixed voltage 41 and starts to supply the negative fixed voltage 42 to the motor 2.

In some embodiments, the time length for the inverter 1 to provide the negative fixed voltage 42 is the same as the time length for providing the positive fixed voltage 41, which is 4.6 millisecond in the embodiment of FIG. 5. Therefore, the inverter 1 obtains a complete square wave voltage 4 based on the positive fixed voltage 41 and the negative fixed voltage 42, and the frequency of the square wave voltage 4 is the reciprocal of twice the touch time. As shown in the implementation of FIG. 5, the frequency is about 108.7 Hz (1/(4.6 millisecond+4.6 millisecond)). When the inverter 1 measures the inductance value of the motor 2 in the following procedure, the inverter 1 will apply the square wave voltage 4 with the frequency to the motor 2.

Back to FIG. 3, after step S40, the inverter 1 obtains the square wave voltage 4 and the fixed frequency of the square wave voltage 4 suitable for the motor 2. Next, the inverter 1 applies the square wave voltage 4 with the fixed frequency to a first axis of two axes of the motor 2 (step S42). During the period of applying the square wave voltage 4 with the fixed frequency, the three-phase current fed back by the motor 2 is continuously detected and converted into the axial current of the first axis (step S44).

In some embodiments, the above-mentioned first axis may be a D-axis or a Q-axis of the motor 2, here is not intended to be limiting.

In some embodiments, after a set of the square wave voltage 4 is applied (e.g., after a time corresponding to the fixed frequency elapses), the inverter 1 calculates the first inductance value of the first axis based on the fixed frequency, the voltage value of the square wave voltage, and the current value of the axial current (step S46). In addition, the inverter 1 establishes a parameter table of inductance versus current according to the first inductance value and the corresponding current value, and then stores the parameter table in a memory (for example, the parameter table 12 shown in the FIG. 1). In the embodiment that the inverter 1 performs the tuning procedure for the D-axis of the motor 2, the first axis is a D-axis, and the first inductance value is a D-axis inductance value. In the embodiment that the inverter 1 performs the tuning procedure for the Q-axis of the motor 2, the first axis is the Q-axis, and the first inductance value is a Q-axis inductance value.

In some embodiments, the inverter 1 continuously provides the square wave voltage 4 with the fixed frequency to the first axis of the motor 2 for a period of measurement time (for example, 0.5 seconds). Taking the embodiment of FIG. 5 as an example (for example, one cycle is 9.2 millisecond), the inverter 1 provides the square wave voltage 4 at least 54 times during the measurement time.

In some embodiments, when the square wave voltage 4 is injected, the feedback current 3 of the motor 2 will gradually increase, and finally converge to a steady state value. Therefore, by continuously supplying the square wave voltage 4 during the measurement time, the inverter 1 obtains a plurality of current points in a section, and then the inductance value corresponding to each current point is calculated through an equation. Compared with the method in the related art that needs to measure multiple required current points separately, the method of the present disclosure may effectively shorten an overall measurement time (for example, to the above-mentioned 0.5 second).

In some embodiments, after step S46 (for example, one cycle ends), the inverter 1 determines whether a preset cycle quantity (for example, 50 cycles or 100 cycles, etc.) or a preset time (for example, the above-mentioned 0.5 seconds) elapse (step S48). If the preset cycle quantity or the preset time does not elapse, the inverter 1 returns to step S42 to continuously provide the square wave voltage with the fixed frequency to the first axis of the motor 2, detects the three-phase current fed back by the motor 2, converts the three-phase current to the axial current, and calculates the corresponding first inductance value. As mentioned above, since the feedback current of the motor 2 continues to increase and is finally converged, the axial current detected by the inverter 1 in each cycle is different, and the calculated first inductance value is also different.

Figure 9:
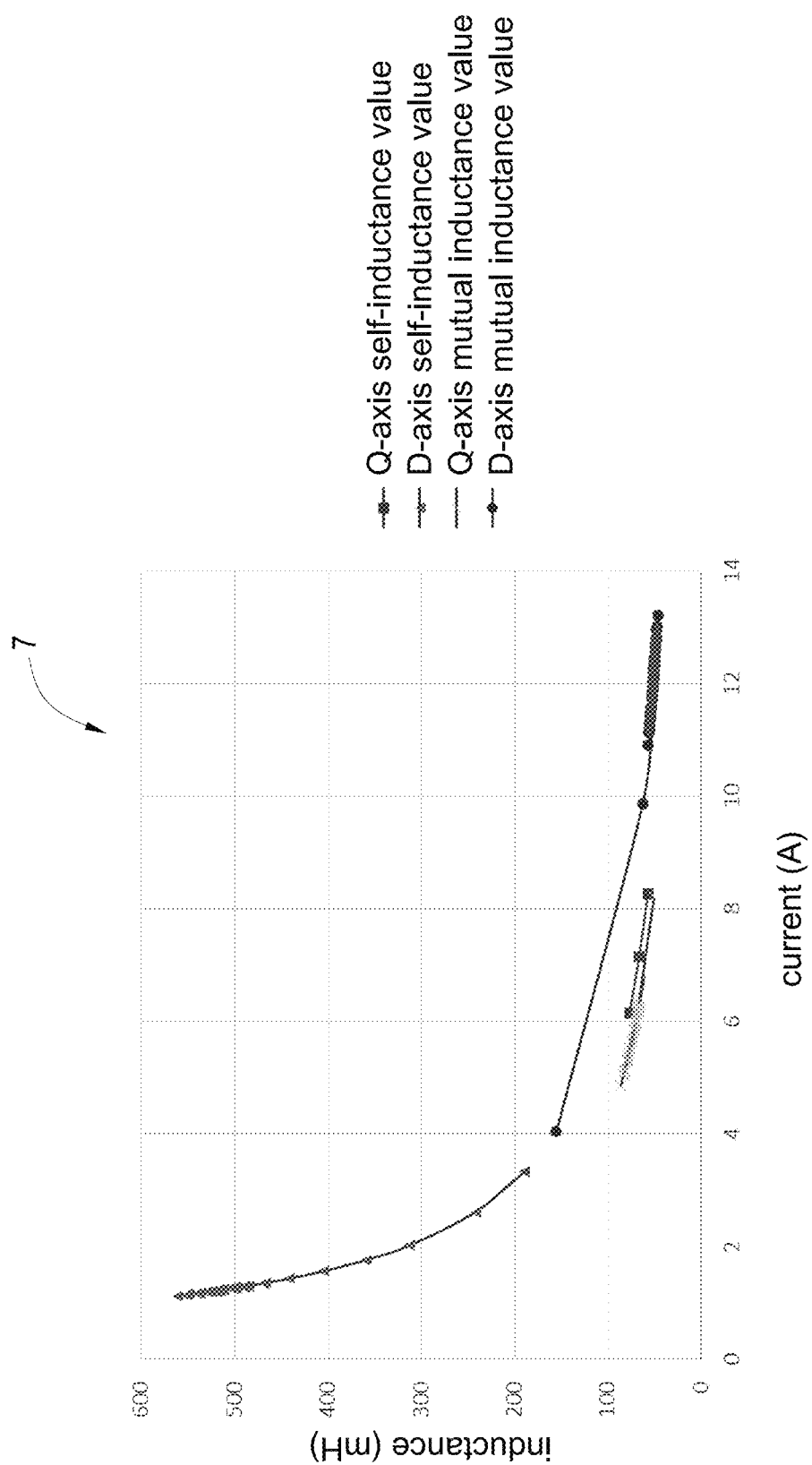
FIG. 9 is a specific embodiment of the schematic diagram of a current-inductance parameter of the present disclosure.

In some embodiments, if it is determined in step S48 that the preset cycle quantity or the preset time elapses, the inverter 1 establishes the parameter table of inductance versus current according to the multiple first inductance values being calculated and the multiple current values corresponding to each of the first inductance values (step S50). In some embodiment, the first inductance values recorded in the parameter table 12 forms a curve change with the corresponding current points (for example, as shown in FIG. 9), that is, a corresponding inductance value is recorded for each measured current point.

In some embodiments, the inverter 1 in step S46 mainly performs an electrochemistry impedance spectroscopy (EIS) based on the fixed frequency of the square wave voltage 4, the voltage value of the square wave voltage 4, and the current value of the axial current, and then the inverter 1 calculates the first inductance value of the first axis of the motor 2 relative to the axial current.

It is worth mentioning that the relevant calculation equation of the EIS is mainly applied to the sine wave situation. In the present disclosure, the inverter 1 provides the square wave voltage 4 to the motor 2, so the calculation method is slightly different from the sine wave. In some embodiments, the inverter 1 performs the EIS based on the fixed frequency of the square wave voltage 4, the voltage value of the square wave voltage 4, the current value of the axial current, and an adjustment gain (AG) in step S46, and then the inverter 1 calculates the first inductance value of the first axis of the motor 2 with respect to this axial current. Wherein, the AG is used to convert square wave parameters into sine wave parameters, so that the EIS may be effectively applied in the method of the present disclosure.

In some embodiments, the inverter 1 calculates the first inductance value through the following first formula:

$$Z = \frac{V_{rms}}{I_{rms} \times AG} = R_s + jwL\circ$$

In the above first formula, Z is an impedance of the motor 2, $V_{rms}$ is a root mean square value of the square wave voltage 4, $I_{rms}$ is a root mean square value of the axial current, AG is the adjustment gain, $R_s$ is the resistance value, w is the fixed frequency of the square wave voltage 4, and L is the first inductance value.

In some embodiments, if $V_{rms}$ is 273.5V, $I_{rms}$ is 0.7523 A, $R_s$ is 6.04, touch time is 4.4 ms, and AG is $$\frac{2\sqrt{3}}{\pi},$$

the inverter 1 obtains the corresponding axial current according to the following equation the first inductance value.

$$Z = \frac{273.5}{0.7523 \times \frac{2\sqrt{2}}{\pi}} = 6.04 + jwL\circ. \quad (1)$$

$$w = \frac{2\pi}{0.0088} = 714\left(\frac{\text{rad}}{s}\right)\circ. \quad (2)$$

$$L = \frac{\sqrt{Z^2 - R_s^2}}{w} = 461 \text{ mH}\circ. \quad (3)$$

However, the above is only one of the specific implementation examples of the present disclosure.

It is worth mentioning that the inverter 1 uses the same method to perform the D-axis self-inductance tuning procedure and the Q-axis self-inductance tuning procedure for the motor 2 (for example, the steps shown in FIG. 3). The difference between the D-axis self-inductance tuning procedure and the Q-axis self-inductance tuning procedure is that whether the square wave voltage 4 is provided to the D-axis or the Q-axis in step S42, and whether the three-phase currents are converted into a D-axis current or a Q-axis current in step S44.

Figure 6:
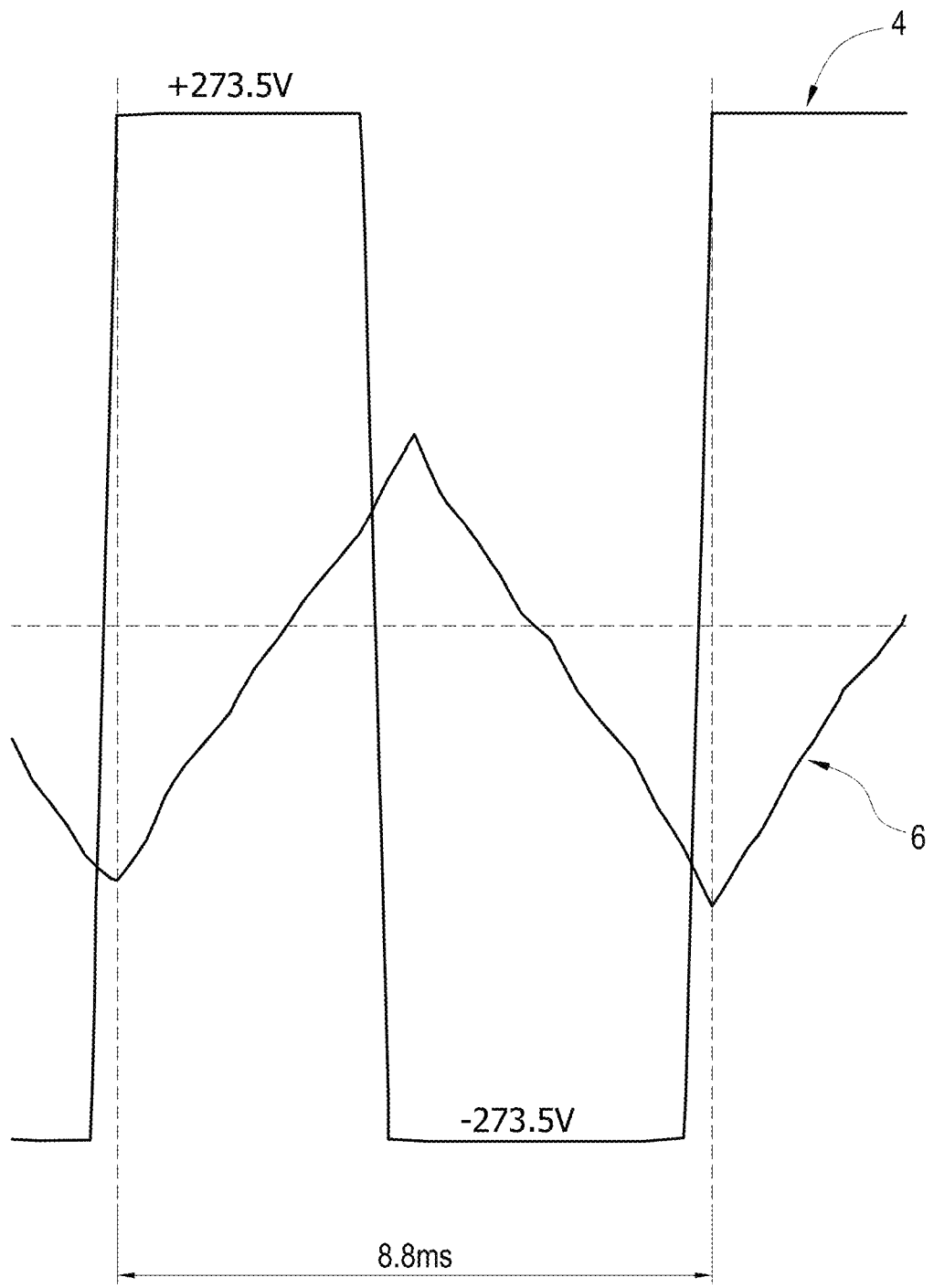
FIG. 6 is a first specific embodiment of a schematic diagram of a feedback current according to the present disclosure.
Figure 7:
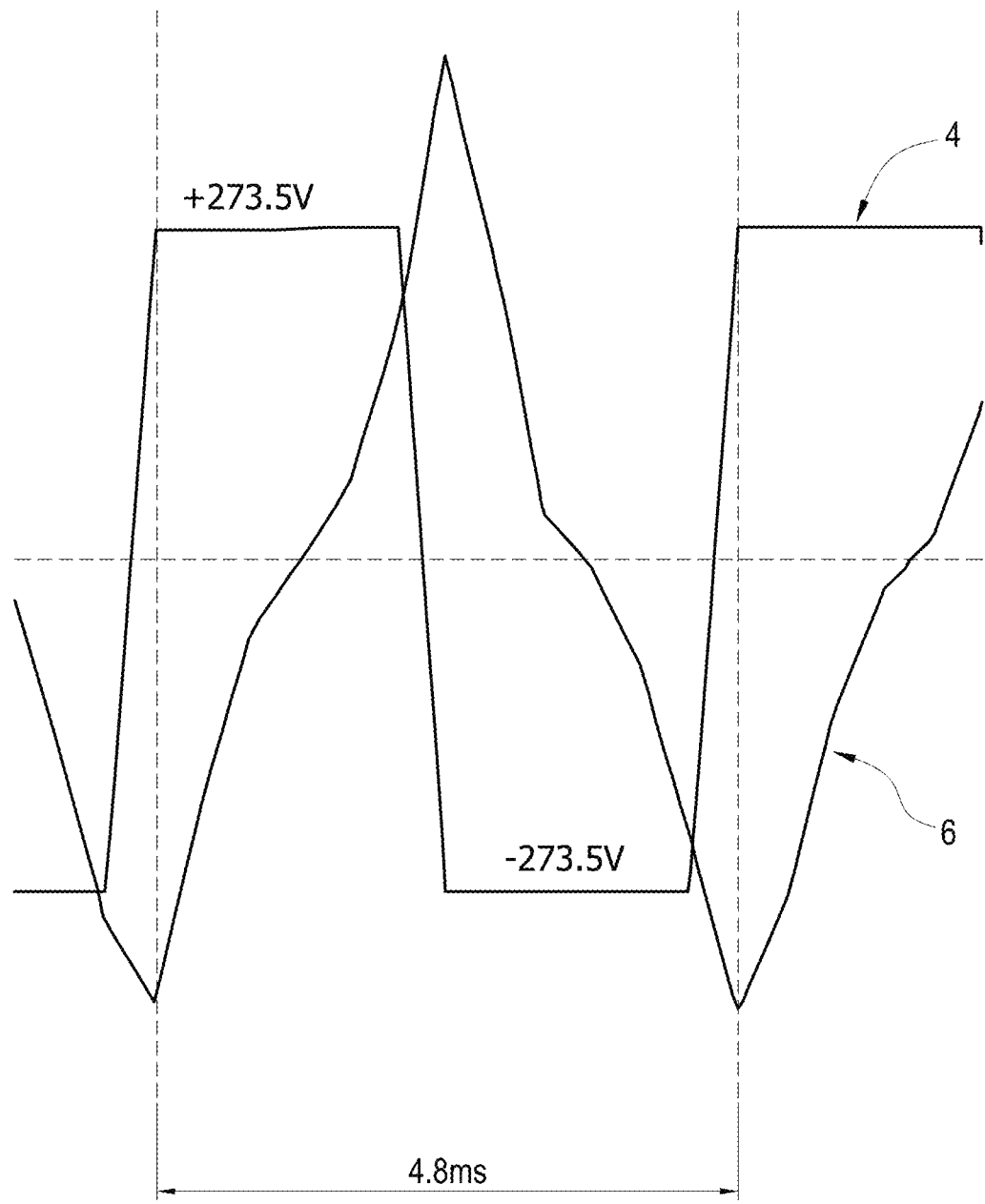
FIG. 7 is a second specific embodiment of a schematic diagram of a feedback current according to the present disclosure.

Please refer to FIG. 6 and FIG. 7. FIG. 6 is a first specific embodiment of a schematic diagram of the feedback current according to the present disclosure, and FIG. 7 is a second specific embodiment of a schematic diagram of the feedback current according to the present disclosure. FIG. 6 shows a current waveform obtained after supplying the square wave voltage 4 of ±273.5 V to the D-axis of the motor 2 for 8.8 millisecond, and FIG. 7 shows a current waveform obtained after the square wave voltage 4 of 273.5 V is applied to the Q-axis of the motor 2 for 4.8 millisecond.

As shown in FIG. 6 and FIG. 7, when the inverter 1 provides the square wave voltage 4 to the D-axis of the motor 2, the feedback current 6 in the form of a triangular wave is detected from the D-axis of the motor 2; when the inverter 1 provides the square wave voltage 4 to the Q-axis of the motor 2, the feedback current 6 in the form of a triangular wave is detected from the Q-axis of the motor 2.

As mentioned above, since the inverter 1 provides the square wave voltage 4, the feedback current 6 is in the form of a triangular wave. To calculate the D-axis self-inductance value and the Q-axis self-inductance value corresponding to the D-axis current/Q-axis current through the above EIS method, an AG that converts square wave parameters into sine wave parameters must be applied in the above equation by the inverter 1.

In addition, when the inverter 1 performs the D-axis mutual inductance tuning procedure and the Q-axis mutual inductance tuning procedure for the motor 2 through the square wave voltage 4, waveforms similar to those in FIG. 6 and FIG. 7 may be obtained, and thus the detailed description thereof is not repeated here.

As mentioned above, the present disclosure injects the square wave voltage 4 at the known rotor position of the motor 2, and calculates the corresponding inductance value according to the feedback current obtained in each cycle. If the inverter 1 provides a square wave voltage 4 to the D-axis without exciting the Q-axis, the D-axis self-inductance value is obtained by calculation. If the inverter 1 provides the square wave voltage 4 to the Q-axis without exciting the D-axis, the Q-axis self-inductance value is obtained by calculation. On the other hand, if the inverter 1 first excites the other axis of the motor 2, and then provides the square wave voltage 4 to the main axis, the inverter 1 may obtain the D-axis mutual inductance value/the Q-axis mutual inductance of the motor 2 by calculation.

Figure 4:
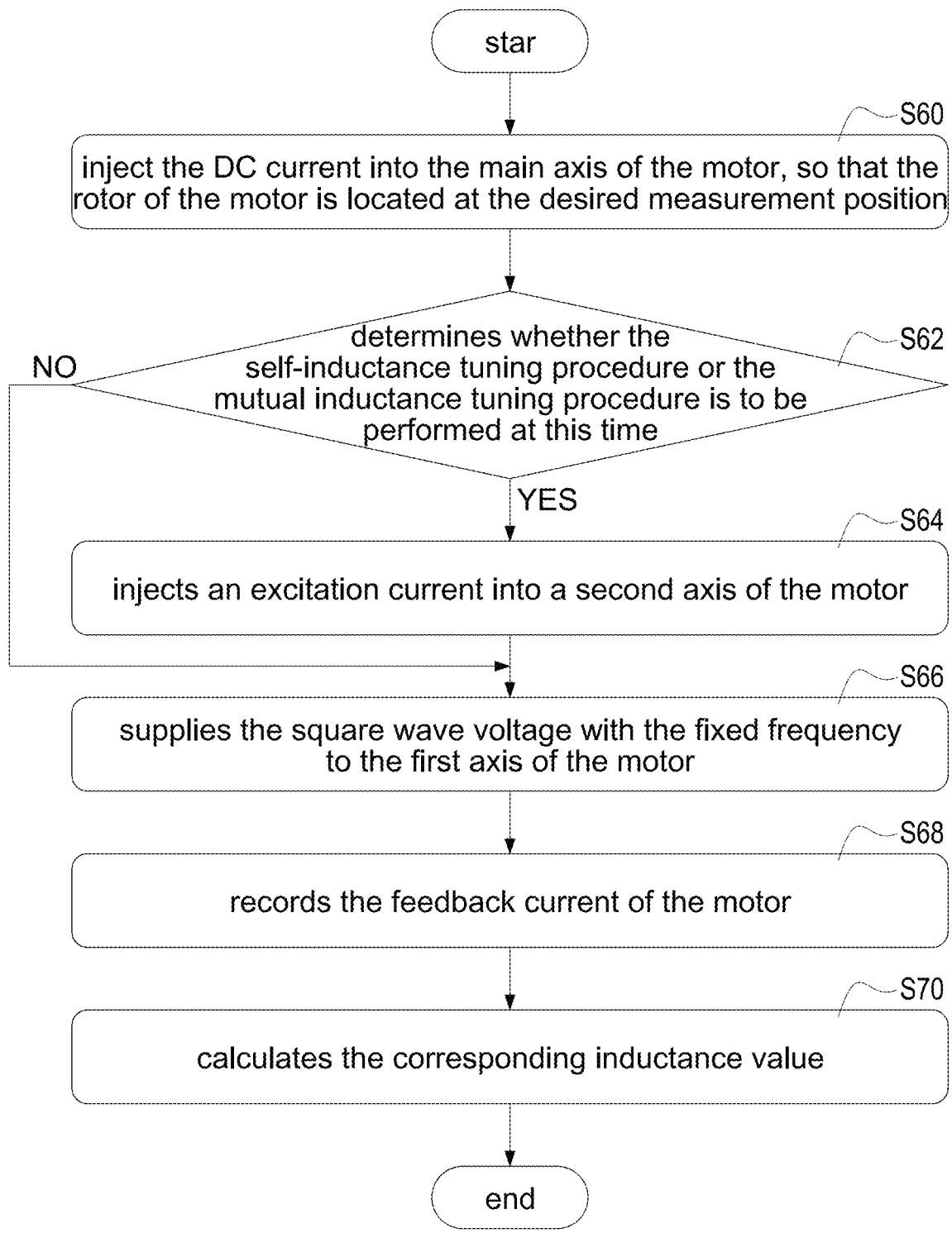
FIG. 4 is a second specific embodiment of the measurement flow chart of the present disclosure.

Please refer to FIG. 4, which is a second specific embodiment of the measurement flow chart of the present disclosure. FIG. 4 discloses the specific steps when the inverter 1 measures the inductance value of the motor 2, and the steps shown in FIG. 4 are applicable to the measurement for the D-axis self-inductance value, the Q-axis self-inductance value, the D-axis mutual inductance, and the Q-axis mutual inductance of the motor 2.

As shown in FIG. 4, in some embodiment, a square wave voltage 4 is injected into the known rotor position of the motor 2 by the inverter 1 during the measurement. In order to do so, the inverter 1 first needs to inject the direct current into the main axis of the motor 2 (hereinafter referred to as the first axis), so that the rotor of the motor 2 may be located at the desired measurement position (step S60). In some embodiments, the rotor of the motor 2 has only one measurement position. No matter whether the inverter 1 is to measure the D-axis self-inductance value, the Q-axis self-inductance value, the D-axis mutual inductance value, or the Q-axis mutual inductance value of the motor 2 at this time, the inverter 1 injects a direct current into the D-axis of the motor 2 in step S60.

Next, the inverter 1 determines whether the self-inductance tuning procedure or the mutual inductance tuning procedure is to be performed at this time (step S62). That is, the inverter 1 determines that the self-inductance value or the mutual inductance value is to be measured at this time.

It is worth mentioning that the inverter 1 uses the same method to perform the self-inductance tuning procedure and the mutual inductance tuning procedure. The difference between performing the self-inductance tuning procedure and the mutual inductance tuning procedure is that when the inverter 1 performs the mutual inductance tuning procedure, it is necessary for the inverter 1 to excite the other axial of the motor 2 in advance.

As shown in FIG. 4, after step S60, the inverter 1 determines whether the self-inductance tuning procedure or the mutual inductance tuning procedure is currently to be performed (step S62). If the mutual inductance tuning procedure is to be performed, the inverter 1 first injects an excitation current into a secondary axis of the motor 2 (hereinafter referred to as a second axis) before providing the square wave voltage 4 to the first axis of the motor 2, so that the second axis is excited (step S64). If the self-inductance tuning procedure is to be performed, the inverter 1 does not need to excite the second axial of the motor 2, that is, the step S64 is unnecessary to be performed.

In some embodiments, if the inverter 1 is to perform the tuning procedure of the D-axis self-inductance value or the Q-axis self-inductance value of the motor 2, the step S64 is unnecessary to be performed. If the inverter 1 is to perform the tuning procedure of the D-axis mutual inductance value of the motor 2, the direct current is injected into the Q-axis of the motor 2 to excite the Q-axis in the step S64. If the inverter 1 is to perform the tuning procedure of the Q-axis mutual inductance value of the motor 2, the direct current is injected to the D-axis of the motor 2 to excite the D-axis in the step S64.

Next, the inverter 1 supplies the aforementioned square wave voltage 4 with the fixed frequency to the first axis of the motor 2 (step S66), and the inverter 1 records the feedback current of the motor 2 (step S68). Therefore, the inverter 1 calculates the corresponding inductance value according to the frequency, the voltage value, and the current value in each cycle (step S70).

In some embodiment, the inverter 1 completely performs steps S60 to S70 shown in FIG. 4 once in each cycle. As steps S42 to S48 shown in FIG. 3, after the inverter 1 operates for multiple cycles, multiple inductance values corresponding to multiple current points are obtained, and then the parameter table 12 of inductance versus current is established and stored.

In one embodiment, before controlling the motor 2, the inverter 1 must perform the self-inductance tuning procedure and may selectively perform the mutual inductance tuning procedure. When the inverter 1 performs the self-inductance tuning procedure, it is preferable to first perform the self-inductance tuning procedure for the D-axis of the motor 2 to establish a D-axis self-inductance parameter table and then perform the self-inductance tuning procedure for the Q-axis of the motor 2 procedure to establish a Q-axis self-inductance parameter table.

Specifically, if the actual execution action of the inverter 1 is applied into the flow chart shown in FIG. 4, the inverter 1 performs the following steps in sequence:

1. The direct current is injected into the D-axis of the motor 2 by the inverter 1, so that the rotor of motor 2 is located at the desired measurement position.
2. The inverter 1 determines that the self-inductance tuning procedure for the D-axis is currently performed.
3. The inverter 1 continuously provides the square wave voltage 4 with the fixed frequency to the D-axis of the motor 2, wherein the fixed frequency is measured according to the steps S30 to S40 shown in FIG. 3.
4. The inverter 1 continuously detects the three-phase current fed back by the motor 2 while providing the square wave voltage 4, and converts the three-phase current into the D-axis current for the D-axis.
5. At the end of this cycle, the inverter 1 calculates the corresponding D-axis self-inductance value based on the fixed frequency, the voltage value ($V_{rms}$) of the square wave voltage 4, and the current value ($I_{rms}$) of the D-axis current.
6. The inverter 1 determines whether the preset cycle quantity (for example, 100 cycles) or a preset time (for example, 0.5 seconds) elapse. If the preset cycle quantity or the preset time does not elapse, the inverter 1 performs the above step 1 to step 5 again in the next cycle; If the preset cycle quantity or the preset time elapses, the inverter 1 performs the following step 7 in the next cycle.

7. The inverter 1 establishes the D-axis self-inductance parameter table according to the multiple D-axis self-inductance values and the current values corresponding to each D-axis self-inductance value, and the inverter 1 stores the D-axis self-inductance parameter table in the memory of the inverter 1.

8. After the D-axis self-inductance parameter table is established, the inverter 1 injects the direct current to the D-axis of the motor 2, so that the rotor of the motor 2 is located at the desired measurement position.

9. The inverter 1 determines that the self-inductance tuning procedure for the Q-axis is currently performed.

10. The inverter 1 continuously supplies the square wave voltage 4 with the fixed frequency to the Q-axis of the motor 2.

11. The inverter 1 continuously detects the three-phase current fed back by the motor 2 while providing the square wave voltage 4, and converts the three-phase current into the Q-axis current for the Q-axis.

12. At the end of this cycle, the inverter 1 calculates the corresponding Q-axis self-inductance value based on the fixed frequency, the voltage value ($V_{rms}$) of the square wave voltage 4 and the current value ($I_{rms}$) of the Q-axis current.

13. The inverter 1 determines whether the preset cycle quantity or a preset time elapse. If the preset cycle quantity or the preset time does not elapse, the inverter 1 performs the above step 8 to step 12 again in the next cycle; If the preset cycle quantity or the preset time elapses, the inverter 1 performs the following step 14 in the next cycle.

14. The inverter 1 establishes the Q-axis self-inductance parameter table according to the multiple Q-axis self-inductance values and the current values corresponding to each Q-axis self-inductance value, and the inverter 1 stores the Q-axis self-inductance parameter table in the memory of the inverter 1.

As mentioned above, the mutual inductance effect of some motors is not strong enough, so the inverter 1 may ignore the mutual inductance tuning procedure. In other words, the inverter 1 may not obtain the D-axis mutual inductance value and the Q-axis mutual inductance value of the motor 2. If the inverter 1 needs to perform the mutual inductance tuning procedure, as shown in FIG. 2, the inverter 1 will perform the D-axis mutual inductance tuning procedure and the Q-axis mutual inductance after completing the D-axis self-inductance tuning procedure and the Q-axis self-inductance tuning procedure.

Specifically, if the actual execution action of the inverter 1 is applied into the flow chart shown in FIG. 4, the inverter 1 performs the following steps in sequence:

15. After the Q-axis self-inductance parameter table is established, the inverter 1 injects the direct current into the D-axis of motor 2, so that the rotor of motor 2 is located at the desired measurement position.

16. The inverter 1 determines that the mutual inductance tuning procedure for the D-axis is currently performed.

17. The inverter 1 injects the excitation current to the Q-axis of the motor 2.

18. The inverter 1 continuously supplies a square wave voltage 4 with the fixed frequency to the D-axis of the motor 2.

19. The inverter 1 continuously detects the three-phase current fed back by the motor 2 while providing the square wave voltage 4, and converts the three-phase current into the D-axis current for the D-axis.

20. At the end of this cycle, the inverter 1 calculates the corresponding D-axis mutual inductance value based on the fixed frequency, the voltage value ($V_{rms}$) of the square wave voltage 4, and the current value ($I_{rms}$) of the D-axis current.

21. The inverter 1 determines whether the preset cycle quantity or a preset time elapse. If the preset cycle quantity or the preset time does not elapse, the inverter 1 performs the above step 15 to step 20 again in the next cycle; if the preset cycle quantity or the preset time elapses, the inverter 1 performs the following step 22 in the next cycle.

22. The inverter 1 establishes a D-axis mutual inductance parameter table according to the multiple D-axis mutual inductance values and the current values corresponding to each D-axis mutual inductance value, and the inverter 1 stores the D-axis mutual inductance parameter table in the memory of the inverter 1.

23. After the D-axis mutual inductance parameter table is established, the inverter 1 injects the direct current into the D-axis of the motor 2, so that the rotor of the motor 2 is located at the desired measurement position.

24. The inverter 1 determines that the mutual inductance tuning procedure for the Q-axis is currently performed.

25. The inverter 1 injects the excitation current into the D-axis of the motor 2.

26. The inverter 1 continuously supplies the square wave voltage 4 with the fixed frequency to the Q-axis of the motor 2.

27. The inverter 1 continuously detects the three-phase current fed back by the motor 2 while providing the square wave voltage 4, and converts the three-phase current into the Q-axis current for the Q-axis.

28. At the end of this cycle, the inverter 1 calculates the corresponding Q-axis mutual inductance value based on the fixed frequency, the voltage value ($V_{rms}$) of the square wave voltage 4 and the current value ($I_{rms}$) of the Q-axis current.

29. The inverter 1 determines whether the preset cycle quantity or a preset time elapse. If the preset cycle quantity or the preset time does not elapse, the inverter 1 performs the above step 23 to step 28 again in the next cycle; If the preset cycle quantity or the preset time elapses, the inverter 1 performs the following step 30 in the next cycle.

30. The inverter 1 establishes a Q-axis mutual inductance parameter table according to the multiple Q-axis mutual inductance values and the current values corresponding to each Q-axis mutual inductance value, and the inverter 1 stores the Q-axis mutual inductance parameter table in the memory of the inverter 1.

Figure 8:
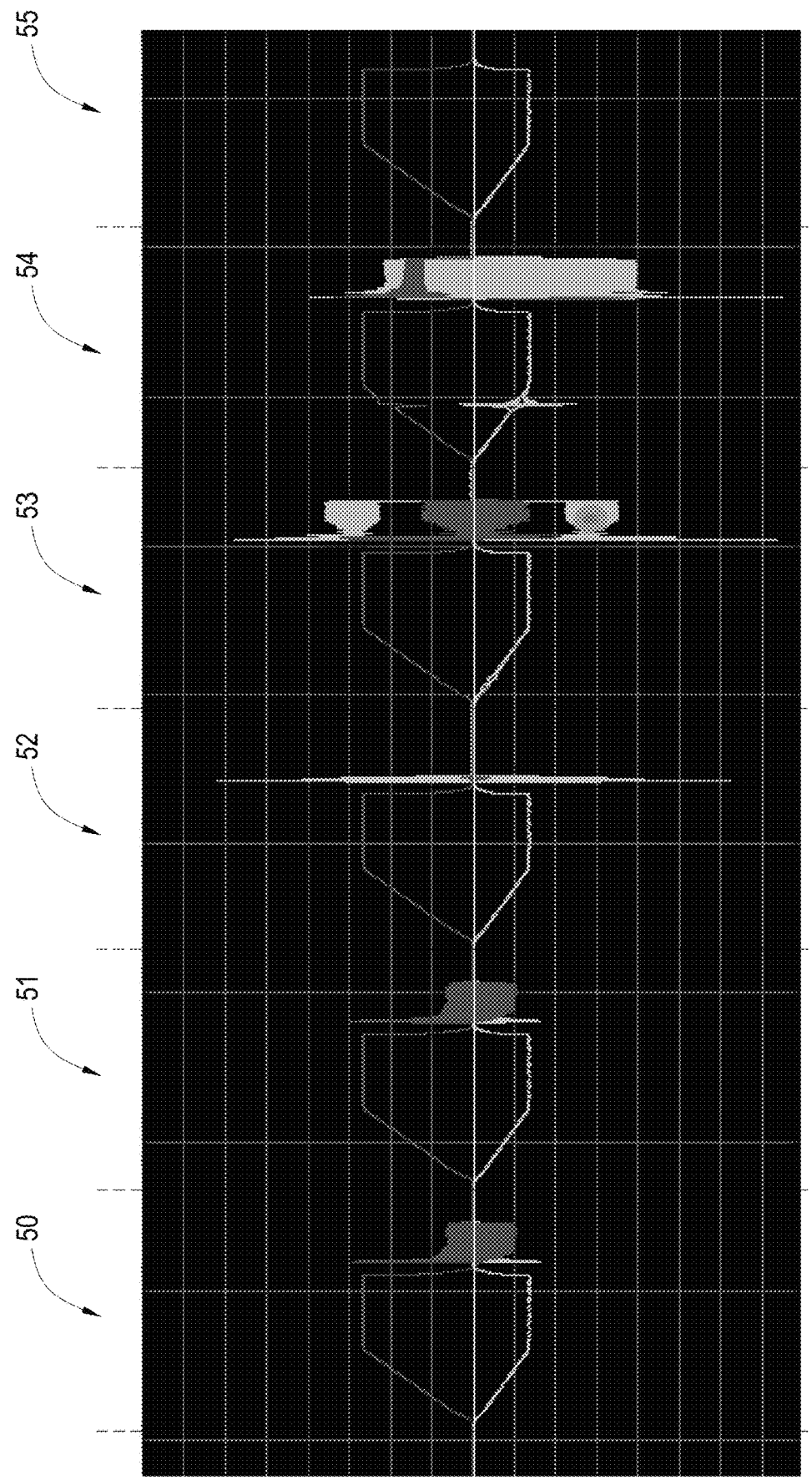
FIG. 8 is a specific embodiment of a schematic diagram of a self-learning waveform of the present disclosure.

Please refer to FIG. 8, which is a specific embodiment of a schematic diagram of a self-learning waveform of the present disclosure. The FIG. 8 shows the following waveforms: a D-axis self-inductance learning experimental waveforms 51 observed based on current when the inverter 1 performs the D-axis self-inductance tuning procedure, a Q-axis self-inductance learning experimental waveform 52 observed based on current when the inverter 1 performs the Q-axis self-inductance tuning procedure, a D-axis mutual inductance learning experimental waveforms 53 observed based on current when the inverter 1 performs the D-axis mutual inductance tuning procedure, and a Q-axis mutual inductance learning experimental waveform 54 observed based on current when the inverter 1 performs the Q-axis mutual inductance tuning procedure, It can be seen from FIG. 8 that, each of the above-mentioned waveforms 51 to 54 respectively includes a front section and a rear section. The front section shows the state that after the inverter 1 injects the direct current into the motor 2, the current gradually converges to a steady state value, wherein the direct current is used to estimate the rotor position of the motor 2; the rear section shows the feedback current state detected from the motor 2 after the inverter 1 injects the square wave voltage 4 into the motor 2.

As shown in the embodiment of FIG. 2, after the D-axis self-inductance tuning procedure, the Q-axis self-inductance tuning procedure, the D-axis mutual inductance tuning procedure, and the Q-axis mutual inductance tuning procedure are all completed, the inverter 1 further injects the direct current into the motor 2 to perform the rotor alignment procedure for the motor 2, thereby returning the rotor to an initial position. As shown in FIG. 8, a rotor alignment experiment waveform 55 presents a current state observed from the motor 2 while the inverter 1 performs the rotor alignment procedure.

In some embodiments, when estimating the rotor position of the motor 2, the direct current needs to be injected into the motor 2, and the parameters such as the inductance value and the resistance value need to be referred as well. However, when the direct current is injected for the first time, the inverter 1 may not have accurate initial value of the parameter, thus causing the estimated rotor position to be inaccurate. In the present disclosure, the inverter 1 injects the direct current into the motor 2 for the first time and observes a measurement waveform 50, and then the inverter 1 injects the direct current into the motor 2 again according to the measurement waveform 50 to estimate the rotor position of the motor 2. In this way, the estimation of the rotor position of the motor 2 performed by the inverter 1 may be more accurate.

In some embodiments, when the inverter 1 performs the D-axis self-inductance tuning procedure, the Q-axis self-inductance tuning procedure, the D-axis mutual inductance tuning procedure, and the Q-axis mutual inductance tuning procedure, the inverter 1 provides the square wave voltage 4 to the motor 2 to obtain the corresponding feedback current and calculates the inductance value corresponding to the feedback current in each cycle. In some embodiments, the fixed frequency of the square wave voltage 4 is set between 100 Hz and 200 Hz. If one tuning procedure is performed for 0.5 seconds, each tuning procedure obtains about 100 inductance values (D-axis self-inductance values, D-axis mutual inductance values, Q-axis self-inductance values, or Q-axis mutual inductance values).

As shown in FIG. 9, it is a specific embodiment of the schematic diagram of a current-inductance parameter of the present disclosure. In some embodiments, after the D-axis self-inductance tuning procedure, the Q-axis self-inductance tuning procedure, the D-axis mutual inductance tuning procedure, and the Q-axis mutual inductance tuning procedure are all completed, the memory of the inverter 1 stores the D-axis self-inductance parameter table, the Q-axis self-inductance parameter table, the D-axis mutual inductance parameter table, and the Q-axis mutual inductance parameter table.

As shown in FIG. 9, the D-axis self-inductance parameter table records the multiple current points and the multiple D-axis self-inductance values respectively corresponding to each current point; the Q-axis self-inductance parameter table records the multiple current points and the multiple Q-axis self-inductance values respectively corresponding to each current point; the D-axis mutual inductance parameter table records the multiple current points and the multiple D-axis mutual inductance values respectively corresponding to each current point; the Q-axis mutual inductance parameter table records the multiple current points and the multiple Q-axis mutual inductance values respectively corresponding to each current point.

In some embodiments, when the motor 2 is controlled by the inverter 1, if the motor 2 is maintained at a fixed speed and the load is continuously increased, the current injected by the inverter 1 will increase continuously and diverge eventually. Meanwhile, a current oscillation effect occurs. If the motor 2 is controlled by the inverter 1 with considering the inductance value recorded in the parameter table 12 established by the method of the present disclosure, a gain may be provided based on a more accurate value during current control, thereby reducing current divergence.

In some embodiments, for the mutual inductance, typical speed sensorless method such as high frequency injection (HFI), flux observer, extend electromotive force (EEMF), or other position estimators all use the mutual inductance value recorded in the parameter table 12 established by the method of the present disclosure, thus achieving a better torque performance.

The above descriptions are only preferred specific embodiments of the present disclosure, and are not intended to limit the present disclosure, all equivalent changes made by using the content of the present disclosure and its similar variations are intended to be included in the scope of the present disclosure.

What is claimed is:

1. A method for obtaining a parameter of a motor being applied to an inverter and comprising:
    a) setting an operating current value of the motor;
    b) providing a positive fixed voltage to the motor and detecting a feedback current of the motor by the inverter;
    c) recording a touch time when the feedback current reaches the operating current value, and providing continually a negative fixed voltage to the motor for the touch time, wherein the touch time is a period of time, and the touch time is counted when starting to detect the feedback current and ended counting when the feedback current reaches the operating current value;
    d) obtaining a square wave voltage with a fixed frequency based on the positive fixed voltage and the negative fixed voltage;
    e) applying the square wave voltage with the fixed frequency to a first axis of the motor;
    f) detecting a three-phase current fed back by the motor and converting the three-phase current into an axial current of the first axis;
    g) calculating a first inductance value of the first axis based on the fixed frequency, voltage values of the positive fixed voltage and the negative fixed voltage of the square wave voltage, and a current value of the axial current; and
    h) establishing and storing a parameter table of inductance versus current according to the first inductance value and the current value of the axial current.

2. The method of claim 1, wherein the operating current value is a maximum operable current value of the motor.

3. The method of claim 1, wherein the step g) comprises performing an electrochemistry impedance spectroscopy (EIS) based on the fixed frequency, the voltage value of the square wave voltage, and the current value of the axial current to calculate the first inductance value of the first axis.

4. The method of claim 3, wherein the step g) comprises performing the EIS based on the fixed frequency, the voltage value of the square wave voltage, the current value of the axial current, and an adjustment gain (AG), wherein the AG is used to convert a square wave parameter into a sine wave parameter.

5. The method of claim 1, further comprising:
g1) determining whether a preset cycle quantity or a preset time elapse after the step g);
g2) performing, by the inverter, the step e), the step f), and the step g) repeatedly to generate a plurality of the first inductance values and a plurality of the current values, if the preset cycle quantity or the preset time does not elapse; and
g3) performing, by the inverter, the step h) according to the plurality of the first inductance values and the current values corresponding to each of the first inductance values, when the preset cycle quantity or a preset time elapse.

6. The method of claim 1, before the step e), further comprising:
e0) injecting a direct current into the first axis of the motor continuously for a rotor of the motor to locate at a measurement position.

7. The method of claim 1, before the step e), further comprising:
e01) determining, by the inverter, whether to perform a self-inductance tuning procedure or a mutual inductance tuning procedure;
e02) performing the step e) directly, when the self-inductance tuning procedure is determined to be performed; and
e03) injecting a direct current to the first axis of the motor first when the mutual inductance tuning procedure is determined to be performed, and then perform the step e), wherein the first axis is a direct axis (D-axis) of the motor.

8. The method of claim 1, after the step h), further comprising:
i) applying the square wave voltage with the fixed frequency to a second axis of the motor;
j) detecting the three-phase current fed back by the motor, and converting the three-phase current into a second axial current of the second axis;
k) calculating a second inductance value of the second axis based on the fixed frequency, voltage values of the positive fixed voltage and the negative fixed voltage of the square wave voltage, and a second current value of the second axis current of the second axis; and
l) establishing and storing the parameter table of inductance versus current according to the second inductance value and the second current value of the second axial current of the second axis.

9. The method of claim 8, further comprising:
m) after the step l), determining, by the inverter, whether to perform a mutual inductance tuning procedure;
n) injecting a direct current to the first axis of the motor first when the mutual inductance tuning procedure is determined to be performed, and then perform the step e) to the step h) again;
o) injecting the direct current to the first axis of the motor first after the step n), and then perform the step i) to the step l) again; and
p) performing, by the inverter, a rotor alignment procedure for the motor after the step o).

10. A method for obtaining a parameter of a motor being applied to an inverter and comprising:
a01) setting an operating current value of the motor;
a02) providing, by the inverter, a positive fixed voltage to the motor continuously and detecting a feedback current of the motor;
a03) recording a touch time when the feedback current reaches the operating current value, and providing continually a negative fixed voltage to the motor for the touch time;
a04) obtaining a square wave voltage with a fixed frequency based on the positive fixed voltage and the negative fixed voltage;
a1) injecting, by the inverter, a direct current into a direct axis (D-axis) of the motor for a rotor of the motor to locate at a measurement position;
a2) providing the square wave voltage with the fixed frequency to the D-axis of the motor;
a3) detecting a three-phase current fed back by the motor, and converting the three-phase current into a first D-axis current;
a4) calculating a D-axis self-inductance value based on the fixed frequency, a voltage value of the square wave voltage, and a current value of the first D-axis current;
a5) performing the step a1) to the step a4) continually before a preset cycle quantity or a preset time elapse;
a6) establishing and storing a D-axis self-inductance parameter table according to a plurality of the D-axis self-inductance values and the current value corresponding to each D-axis self-inductance value, after the preset cycle quantity or the preset time elapses;
b1) injecting, by the inverter, the direct current into the D-axis of the motor after the step a6) for the rotor of the motor to locate at the measurement position;
b2) providing the square wave voltage with the fixed frequency to a quadrature axis (Q-axis) of the motor;
b3) detecting the three-phase current fed back by the motor, and converting the three-phase current into a first Q-axis current;
b4) calculating a Q-axis self-inductance value based on the fixed frequency, the voltage value of the square wave voltage, and a current value of the first Q-axis current;
b5) performing the step b1) to the step b4) continually before the preset cycle quantity or the preset time elapses; and
b6) establishing and storing a Q-axis self-inductance parameter table according to a plurality of the Q-axis self-inductance values and the current value corresponding to each Q-axis self-inductance value, after the preset cycle quantity or the preset time elapses.

11. The method of claim 10, further comprising:
c1) injecting, by the inverter, the direct current into the D-axis of the motor after the step b6) for the rotor of the motor to locate at the measurement position;
c2) injecting an excitation current into the Q-axis of the motor;
c3) providing the square wave voltage with the fixed frequency to the D-axis of the motor;
c4) detecting the three-phase current fed back by the motor, and converting the three-phase current into a second D-axis current;
c5) calculating a D-axis mutual inductance value based on the fixed frequency, the voltage value of the square wave voltage, and a current value of the second D-axis current;

c6) performing the step c1) to the step c5) continually before the preset cycle quantity or the preset time elapses;

c7) establishing and storing a D-axis mutual inductance parameter table according to a plurality of the D-axis mutual inductance values and the current value corresponding to each D-axis mutual inductance value, after the preset cycle quantity or the preset time elapses;

d1) injecting, by the inverter, the direct current into the D-axis of the motor after the step c7) for the rotor of the motor to locate at the measurement position;

d2) injecting the excitation current into the D-axis of the motor;

d3) providing the square wave voltage with the fixed frequency to the Q-axis of the motor;

d4) detecting the three-phase current fed back by the motor, and converting the three-phase current into a second Q-axis current;

d5) calculating a Q-axis mutual inductance value based on the fixed frequency, the voltage value of the square wave voltage, and a current value of the second Q-axis current;

d6) performing the step d1) to the step d5) continually before the preset cycle quantity or the preset time elapses; and d7) establishing and storing a Q-axis mutual inductance parameter table according to the plurality of the Q-axis mutual inductance values and the current value corresponding to each Q-axis mutual inductance value, after the preset cycle quantity or the preset time elapses.

12. A method for obtaining a parameter of a motor being applied to an inverter and comprising:

a01) setting an operating current value of the motor;

a02) providing, by the inverter, a positive fixed voltage to the motor continuously and detecting a feedback current of the motor;

a03) recording, a touch time when the feedback current reaches the operating current value, and providing continually a negative fixed voltage to the motor for the touch time; and a04) obtaining, the square wave voltage with the fixed frequency based on the positive fixed voltage and the negative fixed voltage;

a1) injecting, by the inverter, a direct current into a direct axis (D-axis) of the motor for a rotor of the motor to locate at a measurement position;

a2) providing the square wave voltage with the fixed frequency to the D-axis of the motor;

a3) detecting a three-phase current fed back by the motor, and converting the three-phase current into a first D-axis current;

a4) calculating a D-axis self-inductance value based on the fixed frequency, a voltage value of the square wave voltage, and a current value of the first D-axis current;

a5) performing the step a1) to the step a4) continually before a preset cycle quantity or a preset time elapse, wherein the step a2) uses same square wave voltage with same fixed frequency in every cycle;

a6) establishing and storing a D-axis self-inductance parameter table according to a plurality of the D-axis self-inductance values and the current value corresponding to each D-axis self-inductance value, after the preset cycle quantity or the preset time elapses;

b1) injecting, by the inverter, the direct current into the D-axis of the motor after the step a6) for the rotor of the motor to locate at the measurement position;

b2) providing the square wave voltage with the fixed frequency to a quadrature axis (Q-axis) of the motor;

b3) detecting the three-phase current fed back by the motor, and converting the three-phase current into a first Q-axis current;

b4) calculating a Q-axis self-inductance value based on the fixed frequency, the voltage value of the square wave voltage, and a current value of the first Q-axis current;

b5) performing the step b1) to the step b4) continually before the preset cycle quantity or the preset time elapses, wherein the step b2) uses same square wave voltage with same fixed frequency in every cycle; and b6) establishing and storing a Q-axis self-inductance parameter table according to a plurality of the Q-axis self-inductance values and the current value corresponding to each Q-axis self-inductance value, after the preset cycle quantity or the preset time elapses.

13. The method of claim 12, further comprising:

c1) injecting, by the inverter, the direct current into the D-axis of the motor after the step b6) for the rotor of the motor to locate at the measurement position;

c2) injecting an excitation current into the Q-axis of the motor;

c3) providing the square wave voltage with the fixed frequency to the D-axis of the motor;

c4) detecting the three-phase current fed back by the motor, and converting the three-phase current into a second D-axis current;

c5) calculating a D-axis mutual inductance value based on the fixed frequency, the voltage value of the square wave voltage, and a current value of the second D-axis current;

c6) performing the step c1) to the step c5) continually before the preset cycle quantity or the preset time elapses;

c7) establishing and storing a D-axis mutual inductance parameter table according to a plurality of the D-axis mutual inductance values and the current value corresponding to each D-axis mutual inductance value, after the preset cycle quantity or the preset time elapses;

d1) injecting, by the inverter, the direct current into the D-axis of the motor after the step c7) for the rotor of the motor to locate at the measurement position;

d2) injecting the excitation current into the D-axis of the motor;

d3) providing the square wave voltage with the fixed frequency to the Q-axis of the motor;

d4) detecting the three-phase current fed back by the motor, and converting the three-phase current into a second Q-axis current;

d5) calculating a Q-axis mutual inductance value based on the fixed frequency, the voltage value of the square wave voltage, and a current value of the second Q-axis current;

d6) performing the step d1) to the step d5) continually before the preset cycle quantity or the preset time elapses; and d7) establishing and storing a Q-axis mutual inductance parameter table according to the plurality of the Q-axis mutual inductance values and the current value corresponding to each Q-axis mutual inductance value, after the preset cycle quantity or the preset time elapses.

\* \* \* \* \*